(12) United States Patent
Yu

(10) Patent No.: US 11,948,960 B2
(45) Date of Patent: Apr. 2, 2024

(54) SEMICONDUCTOR PACKAGING METHOD AND SEMICONDUCTOR PACKAGE DEVICE

(71) Applicant: TONGFU MICROELECTRONICS CO., LTD., Nantong (CN)

(72) Inventor: Guoqing Yu, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 414 days.

(21) Appl. No.: 17/317,260

(22) Filed: May 11, 2021

(65) Prior Publication Data

US 2021/0343775 A1 Nov. 4, 2021

Related U.S. Application Data

(63) Continuation of application No. PCT/CN2019/082313, filed on Apr. 11, 2019.

(30) Foreign Application Priority Data

Nov. 12, 2018 (CN) .......................... 201811341259.7
Nov. 12, 2018 (CN) .......................... 201811341284.5

(51) Int. Cl.
*H01L 27/146* (2006.01)

(52) U.S. Cl.
CPC .. *H01L 27/14636* (2013.01); *H01L 27/14618* (2013.01); *H01L 27/1462* (2013.01); *H01L 27/14632* (2013.01); *H01L 27/14685* (2013.01); *H01L 27/14687* (2013.01)

(58) Field of Classification Search
CPC ................................................. H01L 27/14636
See application file for complete search history.

(56) References Cited

FOREIGN PATENT DOCUMENTS

| CN | 101814445 A | 8/2010 |
|---|---|---|
| CN | 107919332 A | 4/2018 |
| CN | 109545805 A | 3/2019 |
| CN | 109545807 A | 3/2019 |

OTHER PUBLICATIONS

World Intellectual Property Organization (WIPO) International Search Report for PCT/CN2019/082313 dated Jun. 21, 2019 5 Pages.

*Primary Examiner* — David A Zarneke
(74) *Attorney, Agent, or Firm* — Anova Law Group, PLLC

(57) ABSTRACT

A semiconductor packaging method and a semiconductor package device are provided. The packaging method includes providing a chip. The chip includes a chip substrate having a front surface and a back surface, where the front surface includes a photosensitive region; a plurality of pads disposed at the front surface of the chip substrate and around the photosensitive region, where the chip substrate contains a through-hole formed from the back surface of the chip substrate, and the plurality of pads are exposed from the through-hole; and a transparent protection layer over the front surface of the chip substrate, where the transparent protection layer covers the photosensitive region and the plurality of pads. The packaging method also includes electrically connecting each pad of the plurality of pads to a circuit board through a corresponding metal rewiring layer in the through-hole.

20 Claims, 5 Drawing Sheets

SEMICONDUCTOR PACKAGING METHOD AND SEMICONDUCTOR PACKAGE DEVICE

CROSS-REFERENCE TO RELATED APPLICATIONS

This application is a continuation application of PCT Patent Application No. PCT/CN2019/082313, filed on Apr. 11, 2019, which claims the priority of Chinese patent applications No. 201811341259.7, filed on Nov. 12, 2018; and No. 201811341284.5, filed on Nov. 12, 2018, the entirety of all of which is incorporated herein by reference.

FIELD OF THE DISCLOSURE

The present disclosure generally relates to the field of semiconductor manufacturing technology and, more particularly, relates to a semiconductor packaging method and a semiconductor package device.

BACKGROUND

A chip with a photosensitive region is a very important part of a camera device. To protect the photosensitive region of the chip, a commonly used packaging method includes providing a transparent glass cover above the photosensitive region of the chip to protect the photosensitive region of the chip.

On the one hand, because the transparent glass cover is often thick, when passing through the transparent glass, light undergoes refraction, reflection and energy loss, which makes the photosensitive effect of the chip worse. On the other hand, the transparent glass cover is connected with the chip by glue. After a long time of use, the glue tends to fall off, and external dust easy enters the photosensitive region of the chip, which further affects the photosensitive effect of the chip. The disclosed packaging method and package device are directed to solve one or more problems set forth above and other problems in the art.

BRIEF SUMMARY OF THE DISCLOSURE

One aspect of the present disclosure includes a semiconductor packaging method. The packaging method includes providing a chip. The chip includes a chip substrate having a front surface and a back surface, where the front surface includes a photosensitive region; a plurality of pads disposed at the front surface of the chip substrate and around the photosensitive region, where the chip substrate contains a through-hole formed from the back surface of the chip substrate, and the plurality of pads are exposed from the through-hole; and a transparent protection layer over the front surface of the chip substrate, where the transparent protection layer covers the photosensitive region and the plurality of pads. The packaging method also includes electrically connecting each pad of the plurality of pads to a circuit board through a corresponding metal rewiring layer in the through-hole.

Optionally, providing the chip includes providing a wafer. The wafer contains a plurality of chip substrates arranged in a matrix, and a dicing groove is formed between adjacent chip substrates of the plurality of chip substrates. The wafer has a front surface and a back surface, the front surface of the wafer is the front surface of the chip substrate, and the back surface of the wafer is the back surface of the chip substrate. The photosensitive region and the plurality of pads disposed around the photosensitive region are disposed over the front surface of the chip substrate. Providing the chip also includes forming the transparent protection layer over the front surface of the wafer, where the transparent protection layer covers the photosensitive region and the plurality of pads on each chip substrate. In addition, providing the chip includes forming the through-hole in the wafer from the back surface of the wafer at a position corresponding to the dicing groove, to make the plurality of pads on both sides of the dicing groove on each chip substrate be exposed from the through-hole. Further, providing the chip includes cutting the wafer and the transparent protection layer between adjacent two through-holes, to obtain a plurality of single chips.

Optionally, the transparent protection layer is formed by: forming a transparent protection film over the front surface of the wafer by spin coating, dispensing or printing, and curing the transparent protection film to form the transparent protection layer.

Optionally, curing the transparent protection film includes an ultraviolet irradiation, or a baking.

Optionally, before forming the through-hole in the wafer from the back surface of the wafer at the position corresponding to the dicing groove, to make the plurality of pads on both sides of the dicing groove on each chip substrate be exposed from the through-hole, the method further includes: providing a substrate on a side of the transparent protection layer away from the wafer; polishing the back surface of the wafer to make the wafer have a thickness less than or equal to a predetermined thickness; and after electrically connecting the pad of the plurality of pads of the chip to the circuit board through the metal rewiring layer in the through-hole, removing the substrate.

Optionally, forming the through-hole in the wafer from the back surface of the wafer at the position corresponding to the dicing groove, to make the plurality of pads on both sides of the dicing groove on each chip substrate be exposed from the through-hole includes a mechanical cutting method.

Optionally, a size of the through-hole gradually increases from a side at the plurality of pads to the back surface of the chip substrate.

Optionally, electrically connecting each pad of the plurality of pads to the circuit board through the corresponding metal rewiring layer in the through-hole includes forming the metal rewiring layer in the through-hole, where one end of the metal rewiring layer is electrically connected to the pad of the chip, and another end of the metal rewiring layer is electrically connected to the circuit board.

Optionally, forming the metal rewiring layer in the through-hole includes: forming a first mask layer on the back surface of the chip substrate and a surface of the through-hole, and forming a first opening in the first mask layer at a position corresponding to the pad; forming a first seed layer on a surface of the first mask layer away from the chip substrate; forming a second mask layer on a surface of the first seed layer away from the chip substrate, and forming a second opening in the second mask layer above the pad; forming the metal rewiring layer in the second opening; and removing the second mask layer and the first seed layer outside the metal rewiring layer.

Optionally, after removing the second mask layer and the first seed layer outside the metal rewiring layer, the method further includes: forming a first barrier layer on a surface of the metal rewiring layer facing away from the plurality of pads, and forming a third opening in the first barrier layer; and forming a solder ball in the third opening, and electrically connecting the solder ball with the circuit board.

Another aspect of the present disclosure includes a semiconductor package device. The device includes a chip substrate having a front surface and a back surface, where the front surface includes a photosensitive region. The device also includes a plurality of pads disposed at the front surface of the chip substrate and around the photosensitive region. The chip substrate contains a through-hole at a position corresponding to the plurality of pads, and the plurality of pads are exposed from the through-hole. In addition, the device includes a transparent protection layer disposed over the front surface of the chip substrate and covering the photosensitive region and the plurality of pads. Further, the device includes a circuit board electrically connected to each pad of the plurality of pads through a corresponding metal rewiring layer in the through-hole.

Optionally, the transparent protection layer is formed by spin coating, dispensing or printing.

Optionally, the transparent protection layer is made of a material capable of being cured by an ultraviolet irradiation or a baking.

Optionally, the transparent protection layer is made of a material including one or more of an inorganic transparent material and an organic transparent material. The inorganic transparent material includes at least one of silicon nitride and silicon oxynitride, and the organic transparent material includes polysiloxane.

Optionally, a size of the through-hole gradually increases from a side at the plurality of pads to the back surface of the chip substrate.

Optionally, the metal rewiring layer is disposed over the back surface of the chip substrate and extended into the through-hole. One end of the metal rewiring layer is electrically connected to the pad, and another end of the metal rewiring layer is electrically connected to the circuit board.

Optionally, the device further includes a first mask layer disposed between the back surface of the chip substrate and the metal rewiring layer, where the first mask layer contains a first opening at a position corresponding to the pad; and a first seed layer disposed between the first mask layer and the metal rewiring layer, where the pad, the first seed layer, and the metal rewiring layer are electrically connected to each other.

Optionally, the device further includes a first barrier layer disposed on a side of the metal rewiring layer away from the plurality of pads, where the first barrier layer contains a third opening; and a solder ball disposed in the third opening and electrically connecting the metal rewiring layer with the circuit board.

Optionally, the device further includes a first barrier layer disposed on a side of the metal rewiring layer away from the plurality of pads, where the first barrier layer contains a third opening; a second seed layer disposed on a side of the first barrier layer away from the plurality of pads and covering the third opening; an under-ball metal layer disposed on a side of the second seed layer away from the plurality of pads; and a solder ball disposed on a side of the under-ball metal layer away from the plurality of pads, where the solder ball, the under-ball metal layer, the second seed layer, and the metal rewiring layer are electrically connected to each other.

Optionally, the chip substrate has a thickness less than or equal to a predetermined thickness.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
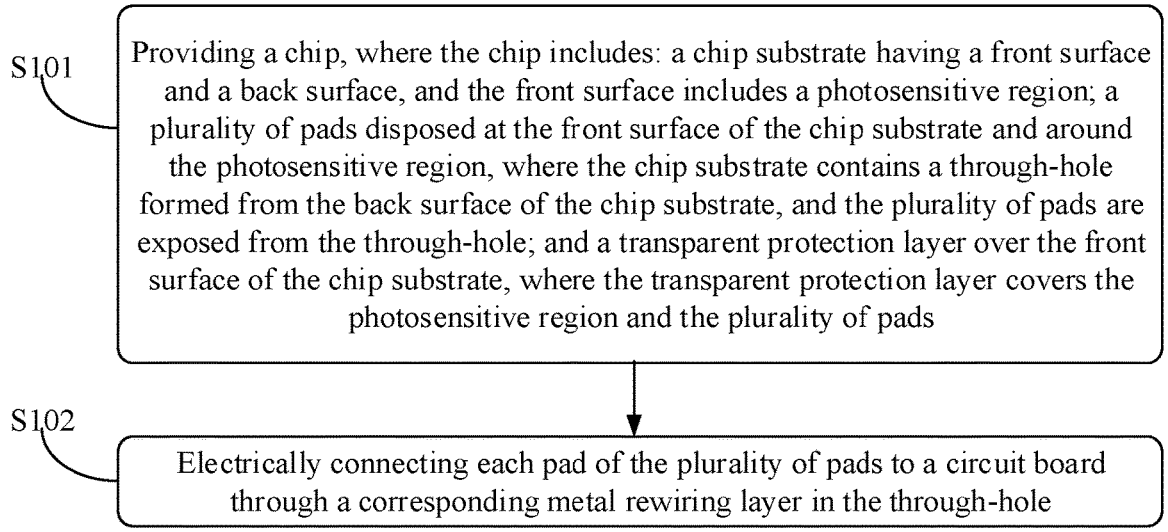
FIG. 1 illustrates a schematic flowchart of an exemplary semiconductor packaging method consistent with various disclosed embodiments of the present disclosure.

FIG. 1 illustrates a schematic flowchart of a semiconductor packaging method consistent with various disclosed embodiments of the present disclosure. Referring to FIG. 1, the packaging method may include following.

In S101: providing a chip. The chip may include a chip substrate. The chip substrate may have a front surface and a back surface, and the front surface may include a photosensitive region. The chip may also include a plurality of pads disposed at the front surface of the chip substrate and around the photosensitive region. Further, the chip may include a transparent protection layer over the front surface of the chip substrate. The transparent protection layer may cover the photosensitive region and the plurality of pads. The chip substrate may contain a through-hole formed from the back surface of the chip substrate, and the plurality of pads may be exposed from the through-holes.

Specifically, the photosensitive region of the chip may be an important part of a semiconductor package device. If the photosensitive region is exposed, external particles may easily pollute the photosensitive region and affect the imaging effect of the photosensitive region. Therefore, it may be necessary to protect the photosensitive region of the chip.

Figure 2:
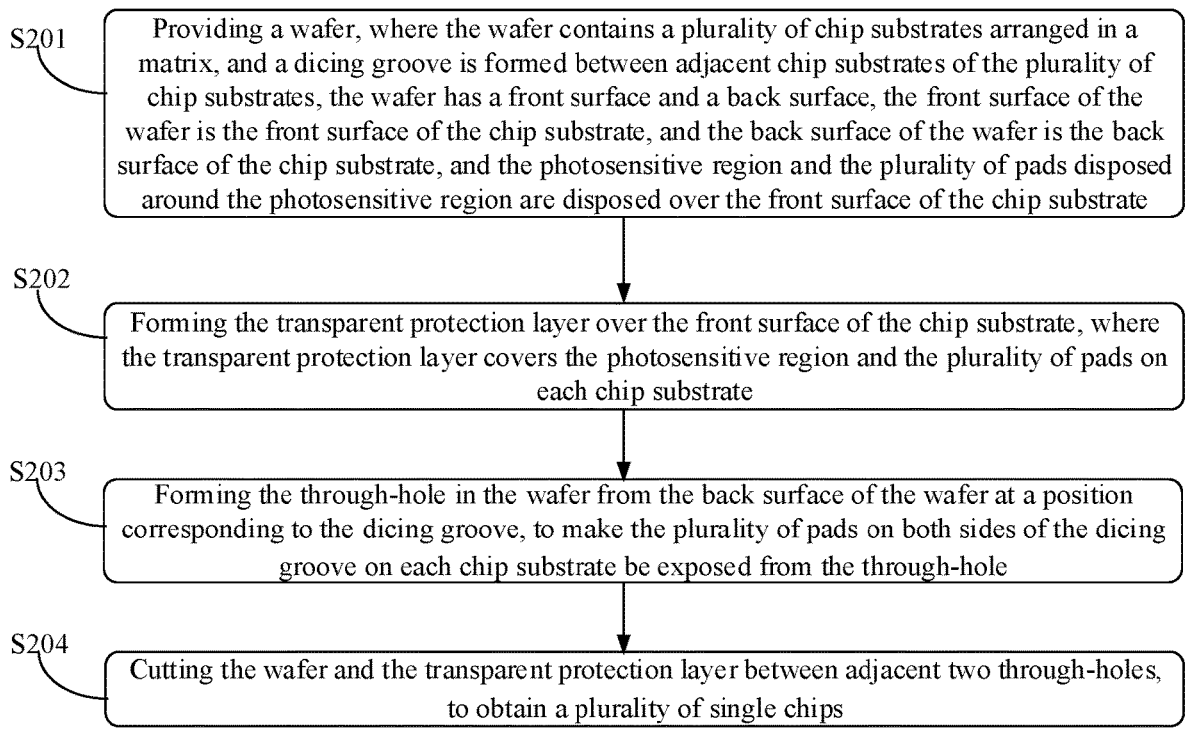
FIG. 2 illustrates a schematic flowchart of a step S101 in FIG. 1 consistent with various disclosed embodiments of the present disclosure.

FIG. 2 illustrates a schematic flowchart of a step S101 in FIG. 1; and FIG. 3 illustrates schematic diagrams of semiconductor structures of a semiconductor package device corresponding to certain stages of steps S201-S204 in FIG. 2. In one embodiment, referring to FIG. 2 and FIGS. 3A-3D, the above step S101 may include following.

Figure 3A:
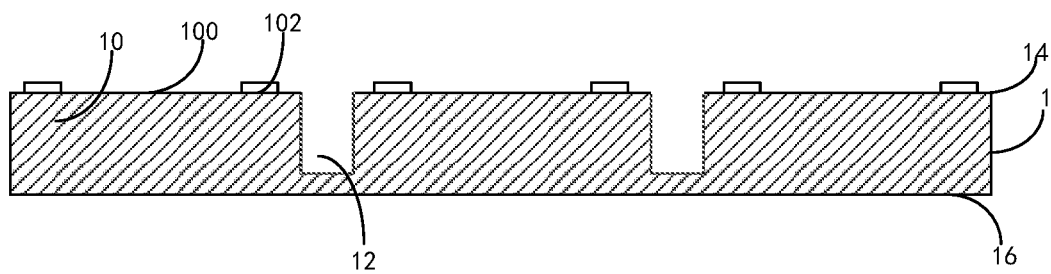
FIGS. 3A-3D illustrate schematic diagrams of semiconductor structures of an exemplary semiconductor package device corresponding to certain stages of steps S201-S204 in FIG. 2 consistent with various disclosed embodiments of the present disclosure.

In S201: providing a wafer 1. Referring to FIG. 3A, the wafer 1 may contain a plurality of chip substrates arranged in a matrix, and a dicing groove 12 may be formed between adjacent chip substrates. The wafer 1 may have a front surface 14 and a back surface 16. The front surface 14 of the wafer 1 may be the front surface 14 of the chip substrate 10, and the back surface 16 of the wafer 1 may be the back surface 16 of the chip substrate 10. The front surface 14 of the chip substrate may include the photosensitive region 100, and the plurality of pads 102 around the photosensitive region 100 may be disposed at the front surface 14 of the chip substrate 10.

In S202: forming a transparent protection layer 18 over the front surface 14 of the wafer 1. The transparent protection layer 18 may cover the photosensitive region 100 and the plurality of pads 102 on each chip substrate.

Figure 3B:
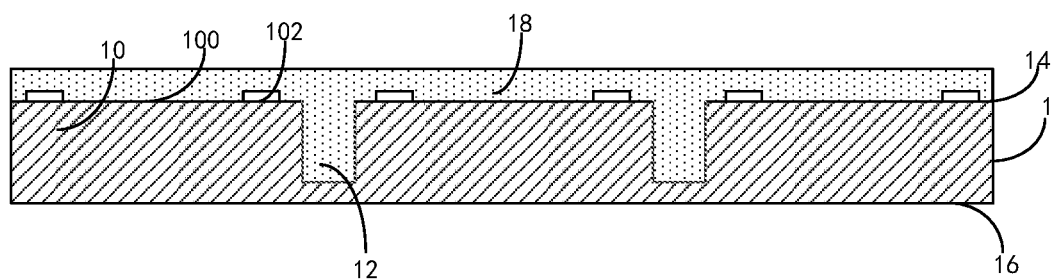

Specifically, in one embodiment, referring to FIG. 3B, the transparent protection layer 18 may also cover the region corresponding to the dicing groove 12. In another embodiment, the transparent protection layer 18 may merely cover the photosensitive region 100 and the plurality of pads 102 on each chip substrate, and may not cover or partially cover the region corresponding to the dicing groove 12.

In another embodiment, forming the transparent protection layer 18 may include: forming a transparent protection film over the front surface 14 of the chip substrate 10 by spin coating, dispensing or printing, and curing the transparent protection film to form the transparent protection layer 18. A thickness of the transparent protection layer 18 formed by the above method may reach the micron level. Compared with the traditional method of providing a transparent glass, the thickness of the transparent protection layer 18 may be less than the thickness of the transparent glass, which may reduce refraction, reflection and energy loss of the light, and may improve the photosensitive effect of the chip.

In one embodiment, the transparent protection layer 18 may be made of an inorganic transparent material, such as silicon nitride, silicon oxynitride, etc. In another embodiment, the transparent protection layer 18 may be made of an organic transparent material, such as polysiloxane. Curing the transparent protection film may include an ultraviolet irradiation or a high-temperature baking, which may be determined according to the initiator added to prepare the transparent protection layer 18. If the initiator is a photoinitiator (e.g., 2-hydroxy-2-methyl-1-phenylacetone, 1-hydroxycyclohexyl phenyl ketone, etc.), the ultraviolet radiation method may be used. If the initiator is a thermal initiator (e.g., benzoyl peroxide, etc.), the high-temperature baking method may be used.

In S203: forming a through-hole 11 in the wafer from the back surface 16 of the wafer 1 at a position corresponding to the dicing groove 12, to make the plurality of pads 102 on both sides of the dicing groove 12 be exposed from the through-hole 11.

Specifically, in one embodiment, before the step S203, the method may further include: providing a substrate on a side of the transparent protection layer 18 away from the chip; and polishing the back surface 16 of the wafer 1 to make the wafer 1 have a thickness less than or equal to the predetermined thickness. Specifically, the side of the transparent protection layer 18 away from the chip may be fixed to the substrate by a removable adhesive film, etc. In addition, the wafer directly taken from the packaging and testing factory may often have a substantially large thickness. Therefore, in one embodiment, the back surface of the wafer 1 may need to be polished to make the wafer 1 have a thickness less than or equal to the predetermined thickness. For example, the predetermined thickness may be approximately 100 μm, and the thickness of the polished wafer 1 may be approximately 50 μm, 60 μm, or 80 μm, etc.

Figure 3C:
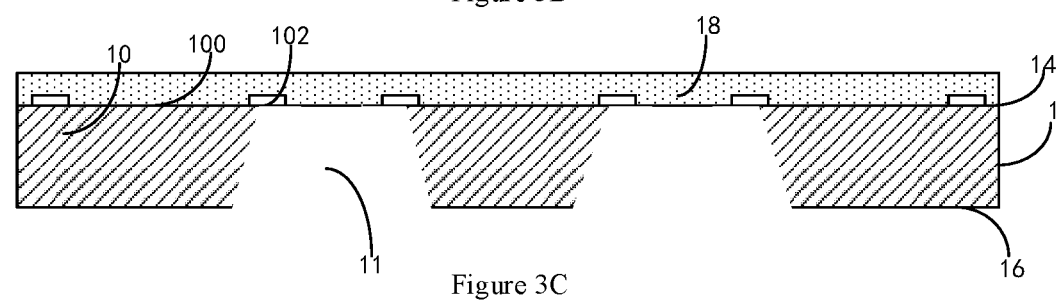

In another embodiment, referring to FIG. 3C, the chip substrate 10 may often be made of silicon. Because silicon has poor electrical conductivity, to achieve the electrical connection between the pad 102 and a subsequent circuit board, the through-hole 11 may be formed in the wafer from the back surface of the wafer. In one embodiment, the wafer 1 may be flipped, and then the through-hole 11 may be formed in the wafer 1 at the position facing opposite to the pad 102. In one embodiment, the through-hole 11 may be formed in the wafer 1 at the position corresponding to the dicing groove 12 from the back surface 16 of the wafer 1 by a mechanical cutting method, to make the plurality of pads 102 on both sides of the dicing groove be exposed from the through-hole 11. In another embodiment, the through-hole 11 may be formed by any other suitable method, which may not be limited by the present disclosure. In one embodiment, the size of the through-hole 11 may gradually increase from a side at the plurality of pads 102 to the back surface 16 of the chip substrate 10, and the plurality of pads 102 may be exposed from the through-hole 11. All or part of each pad of the plurality of pads 102 may be exposed from the through-hole 11.

In S204: cutting the wafer 1 and the transparent protection layer 18 between adjacent two through-holes 11, to obtain a plurality of single chips.

Figure 3D:
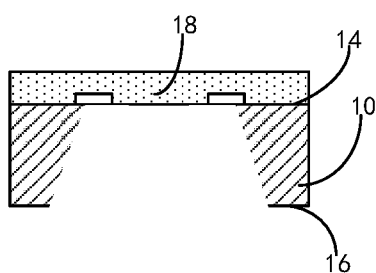

Specifically, in one embodiment, referring to FIG. 3D, cutting the wafer 1 and the transparent protection layer 18 between adjacent two through-holes 11 may include a plasma cutting method, which may not be described in detail herein.

In the above embodiment, the transparent protection layer may be first formed over the wafer, and then the plurality of single chips may be obtained by cutting. In another embodiment, the wafer may be first cut to form single chips, and then the transparent protection layer may be formed on the single chips one by one, which may not be limited by the present disclosure.

In S102: electrically connecting each pad 102 of the chip to a circuit board 23 through a corresponding metal rewiring layer in the through-hole 11.

Specifically, in one embodiment, the above step S102 may specifically include forming a metal rewiring layer 26 in the through-hole 11. One end of the metal rewiring layer 26 may be electrically connected to the pad 102 of the chip, and another end of the metal rewiring layer 26 may be electrically connected to the circuit board 23.

Figure 4:
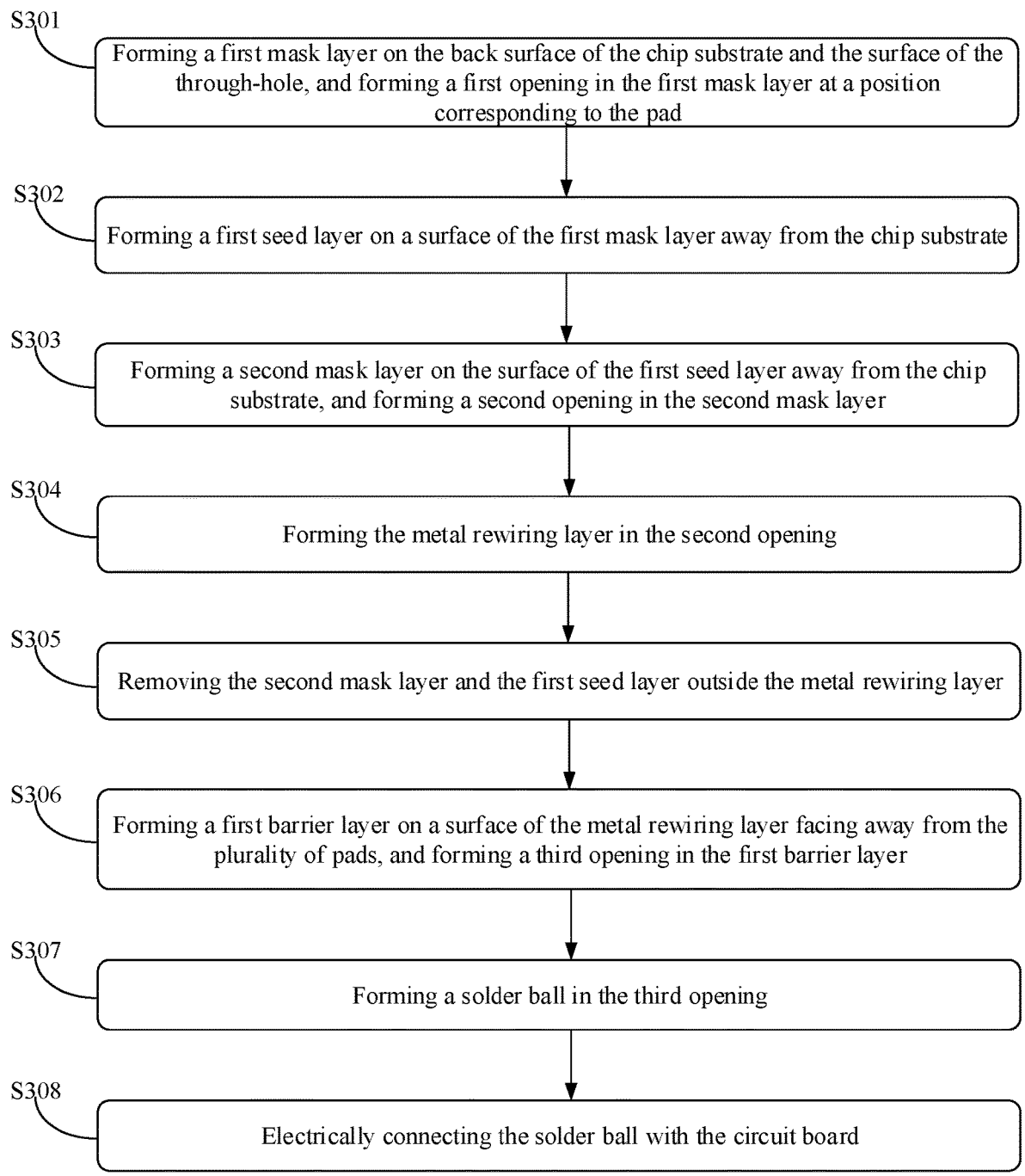
FIG. 4 illustrates a schematic flowchart of a step S102 in FIG. 1 consistent with various disclosed embodiments of the present disclosure.

FIG. 4 illustrates a schematic flowchart of the step S102 in FIG. 1 consistent with various disclosed embodiments of the present disclosure; and FIGS. 5A-5H illustrate schematic diagrams of semiconductor structures of a semiconductor package device corresponding to certain stages of steps S301-S308 in FIG. 4 consistent with various disclosed embodiments of the present disclosure. In one embodiment, referring to FIG. 4 and FIGS. 5A-5H, the above step S102 may include following.

In S301: forming a first mask layer 20 on the back surface 16 of the chip substrate 10 and the surface of the through-hole (not labeled in FIG. 5), and forming a first opening 200 in the first mask layer 20 at a position corresponding to the pad 102.

Figure 5A:
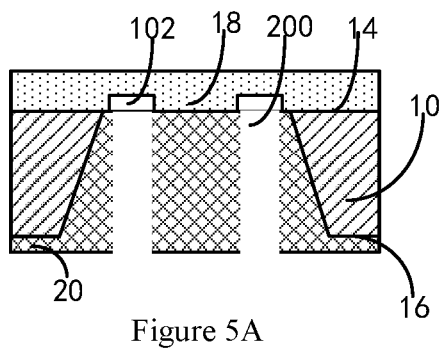
FIGS. 5A-5H illustrate schematic diagrams of semiconductor structures of an exemplary semiconductor package device corresponding to certain stages of steps S301-S308 in FIG. 4 consistent with various disclosed embodiments of the present disclosure.

Specifically, referring to FIG. 5A, in one embodiment, the first mask layer 20 may be first coated on the back surface 16 of the chip substrate 10 and the surface of the through-hole (not labeled in FIG. 5), and then the first opening 200 may be formed in the first mask layer 20 at the position corresponding to the pad 102 by exposure and development processes or any other method, to expose the pad 102. In one embodiment, the first mask layer 20 may be made of one or more of photoresist, silicon oxide, silicon nitride, and amorphous carbon.

In S302: forming a first seed layer 22 on a surface of the first mask layer 20 away from the chip substrate 10.

Figure 5B:
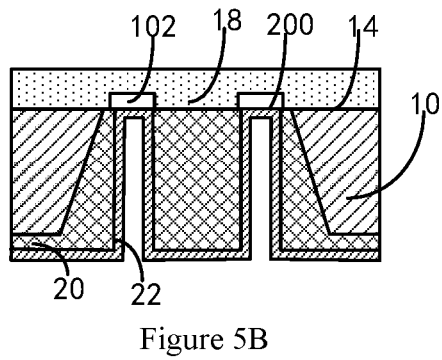

Specifically, referring to FIG. 5B, the first seed layer 22 may be made of one or more of titanium, aluminum, copper, gold, and silver. Forming the first seed layer 22 may include a sputtering process, or a physical vapor deposition process.

In S303: forming a second mask layer 24 on the surface of the first seed layer 22 away from the chip substrate 10, and forming a second opening 240 in the second mask layer 24.

Figure 5C:
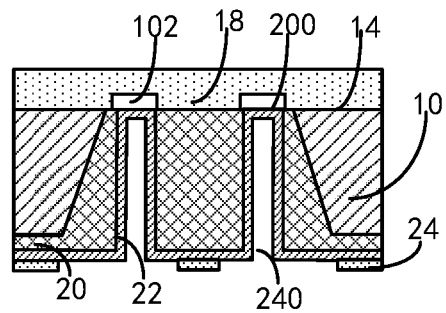

Specifically, referring to FIG. 5C, in one embodiment, the second mask layer 24 may be first coated on the surface of the first seed layer 22 away from the chip substrate 10, and then the second opening 240 may be formed in the second mask layer 24 by exposure and development processes or any other method. The second opening 240 may be formed above the pad 102. In one embodiment, the second mask layer 24 may be made of one or more of photoresist, silicon oxide, silicon nitride, and amorphous carbon.

In S304: forming the metal rewiring layer 26 in the second opening 240.

Figure 5D:
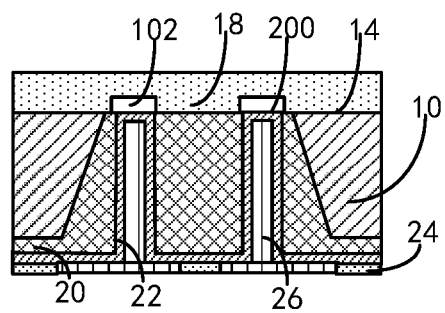

Specifically, referring to FIG. 5D, in one embodiment, the metal rewiring layer 26 may be formed in the second opening 240 by an electroplating process. The metal rewiring layer 26 may be made of copper or any other suitable metal. In one embodiment, a height of the metal rewiring layer 26 may be the same as a depth of the second opening 240. In certain embodiments, the height of the metal rewiring layer 26 may be less than the depth of the second opening 240.

In S305: removing the second mask layer 24 and the first seed layer 22 outside the metal rewiring layer 26.

Figure 5E:
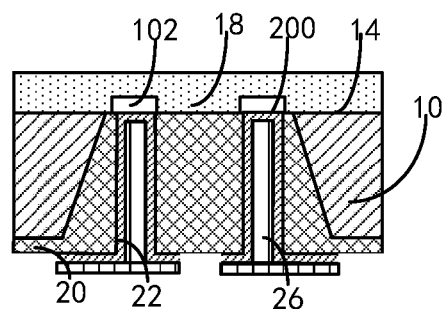

Specifically, referring to FIG. 5E, in one embodiment, the second mask layer 24 may be removed by a photolithography process to expose the first seed layer 22. The exposed portion of the first seed layer 22 may be removed by a wet etching process or a dry etching process, and merely the first seed layer 22 below the metal rewiring layer 26 may be retained. The pad 102, the first seed layer 22, and the metal rewiring layer 26 may be electrically connected to each other.

In S306: forming a first barrier layer 28 on a surface of the metal rewiring layer 26 facing away from the plurality of pads 102, and forming a third opening 280 in the first barrier layer 28.

Figure 5F:
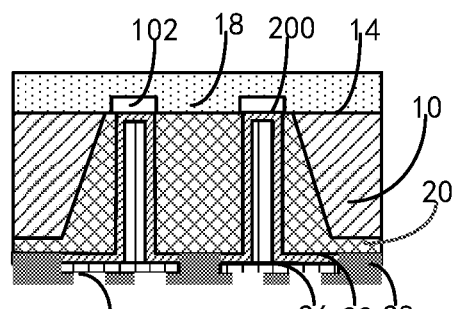

Specifically, referring to FIG. 5F, the first barrier layer 28 may be made of an insulating material. In one embodiment, the third opening 280 may be formed in the first barrier layer 28 by a photolithography process or any other etching method.

In S307: forming a solder ball 21 in the third opening 280.

Figure 5G:
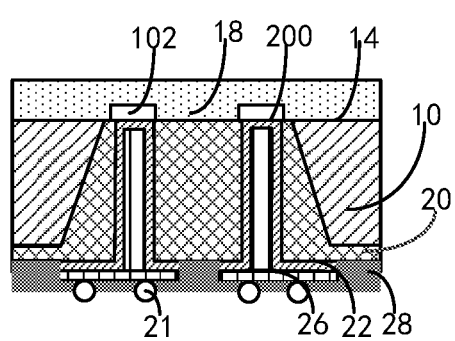

Specifically, referring to FIG. 5G, the solder ball 21 may be directly formed in the third opening 280. For example, the solder ball 21 may be placed in the third opening 280 by using a ball placement device. The solder ball 21 may be made of tin or tin alloy. The solder ball 21 may be electrically connected to the metal rewiring layer 26. In another embodiment, an under-ball metal layer may be formed on the metal rewiring layer 26, and then the ball may be placed on the under-ball metal layer, which may not be limited by the present disclosure.

For example, a second seed layer may be formed on a surface of the first barrier layer away from the pad. The second seed layer may be formed by a sputtering method. A titanium layer may be first formed, and then a copper layer may be sputtered on the titanium layer. A third mask layer may be formed on the surface of the second seed layer away from the pad, and a fourth opening may be formed in the third mask layer at a position corresponding to the third opening. The under-ball metal layer may be formed in the fourth opening. The under-ball metal layer may be made of copper, and may be formed by an electroplating process. The third mask layer and the corresponding second seed layer under the third mask layer may be removed. The solder ball may be formed at a position corresponding to the under-ball metal layer. The solder ball may be formed by dropping a ball at a position corresponding to the under-ball metal layer by the ball placement device, and reflowing the ball. The solder ball, the under-ball metal layer, the second seed layer, and the metal rewiring layer may be electrically connected to each other.

In S308: electrically connecting the solder ball 21 with the circuit board 23.

Figure 5H:
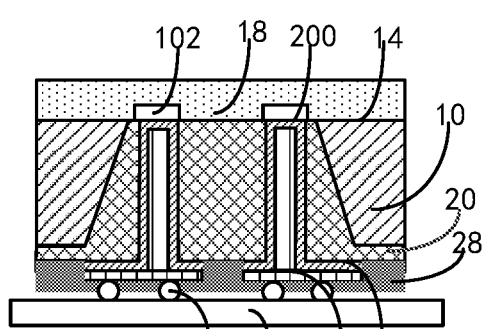

Specifically, referring to FIG. 5H, the solder ball 21 may be electrically connected to the circuit board 23 by a thermal reflow process. The chip may be electrically connected to the circuit board 23 through the above processes In another embodiment, to enhance the waterproof performance of the semiconductor package device, after performing the step S102, the method may further include filling the region between the transparent protection layer 18 and the circuit board 23 with a molding compound, to form a molding layer. The molding layer may not cover the transparent protection layer 18 corresponding to the photosensitive region 100 of the chip. For example, a protection adhesive film may be provided on the side of the transparent protection layer 18 close to the circuit board 23, to control the height of the molding layer, such that a distance between the molding layer and the circuit board 23 may be equal to or less than a distance between the transparent protection layer 18 and the circuit board.

Figure 6:
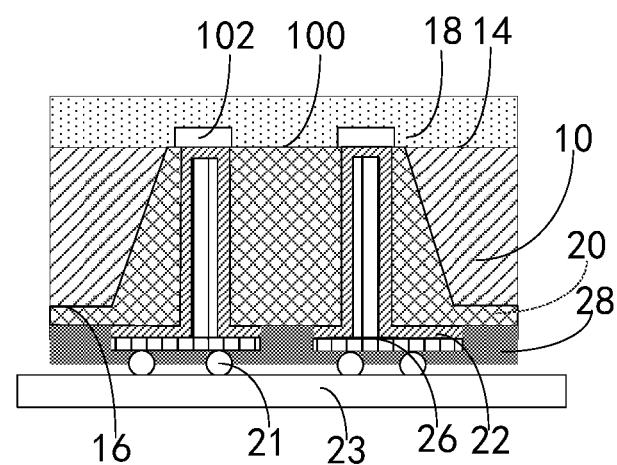
FIG. 6 illustrates a schematic diagram of an exemplary semiconductor package device consistent with various disclosed embodiments of the present disclosure.

The present disclosure also provides a semiconductor package device. The semiconductor package device may be formed by the above-disclosed semiconductor packaging method. FIG. 6 illustrates a schematic diagram of a semiconductor package device consistent with various disclosed embodiments of the present disclosure. Referring to FIG. 6, the semiconductor package device may include a chip substrate, a plurality of pads, a transparent protection layer, and a circuit board.

The chip substrate 10 may have a front surface 14 and a back surface 16, and the front surface 14 may include a photosensitive region 100. The plurality of pads 102 may be disposed at the front surface 14 of the chip substrate 10 and around the photosensitive region 100. The chip substrate 10 may contain a through-hole (not labeled) at a position corresponding to the plurality of pads 102, and the plurality of pads 102 may be exposed from the through-hole. All or part of each pad 102 of the plurality of pads 102 may be exposed from the through-hole. In one embodiment, the through-hole may be formed by a mechanical cutting process. The size of the through-hole may gradually increase from a side at the pads 102 to the back surface 16 of the chip substrate 10.

The transparent protection layer 18 may be disposed over the front surface 14 of the chip substrate 10, and may cover the photosensitive region 100 and the plurality of pads 102 of the chip. Specifically, the transparent protection layer 18 may be formed by spin coating, dispensing or printing. The transparent protection layer 18 may be made of a material capable of being cured by an ultraviolet irradiation or a baking. The transparent protection layer 18 may be made of an inorganic transparent material, such as silicon nitride, silicon oxynitride, etc., or an organic transparent material, such as polysiloxane, etc., which may not be limited by the present disclosure.

The circuit board 23 may be electrically connected to each pad 102 of the chip through the corresponding metal rewiring layer 26 in the through-hole. Specifically, referring to FIG. 6, the metal rewiring layer 26 may be disposed over the back surface 16 of the chip substrate 10 and may be extended into the through-hole. One end of the metal rewiring layer 26 may be electrically connected to the pad 102, and another end of the metal rewiring layer 26 may be electrically connected to the circuit board 23.

In another embodiment, referring to FIG. 6, the semiconductor package device may further include a first mask layer 20 disposed between the back surface 16 of the chip substrate 10 and the metal rewiring layer 26, where the first mask layer 20 may contain a first opening (not labeled) at a position corresponding to the pad 102. The semiconductor package device may further include a first seed layer 22 disposed between the first mask layer 20 and the metal rewiring layer 26. The pad 102, the first seed layer 22, and the metal rewiring layer 26 may be electrically connected to each other.

In another embodiment, the chip may be electrically connected to the circuit board 23 by providing a solder ball 21. Referring to FIG. 6, the semiconductor package device may further include a first barrier layer 28 disposed on the side of the metal rewiring layer 26 away from the pad 102, where the first barrier layer 28 may contain a third opening (not labeled). The semiconductor package device may further include the solder ball 21 disposed in the third opening and electrically connected with the metal rewiring layer 26 and the circuit board 23.

Figure 7:
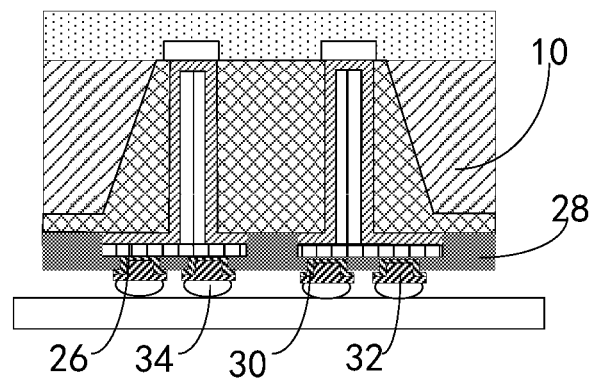
FIG. 7 illustrates a schematic diagram of another exemplary semiconductor package device consistent with various disclosed embodiments of the present disclosure.

In another embodiment, the solder ball may be disposed by any other method, e.g., providing an under-ball metal layer. FIG. 7 illustrates a schematic diagram of another semiconductor package device consistent with various disclosed embodiments of the present disclosure. The same or similar features between the embodiments associated with FIG. 7 and the embodiments associated with FIG. 6 may not be repeated herein. Specifically, referring to FIG. 7, the semiconductor package device may further include a first barrier layer 28 disposed on the side of the metal rewiring layer 26 away from the pad 102, where the first barrier layer 28 may contain a third opening (not labeled). Moreover, the semiconductor package device may include a second seed layer 30 disposed on the side of the first barrier layer 28 away from the pad 102 and covering the third opening. In addition, the semiconductor package device may include an under-ball metal layer 32 disposed on the side of the second seed layer 30 away from the pad 102. Further, the semiconductor package device may include a solder ball 34 disposed on the side of the under-ball metal layer 32 away from the pad 102. The solder ball 34, the under-ball metal layer 32, the second seed layer 30, and the metal rewiring layer 26 may be electrically connected to each other.

In one embodiment, in the present disclosure, the chip of the semiconductor package device may have a thickness less than or equal to a predetermined thickness. For example, the predetermined thickness may be approximately 100 μm, and the thickness of the wafer may be approximately 50 μm, 60 μm, or 80 μm, etc.

Accordingly, in the present disclosure, the transparent protection layer may be directly formed over the front surface of the chip substrate. On the one hand, the thickness of the transparent protection layer may be controlled. Compared with the traditional method where a transparent glass is provided, the thickness of the transparent protection layer may be less than the thickness of the transparent glass, which may reduce refraction, reflection and energy loss of light, and may improve the photosensitive effect of the chip. On the other hand, because the transparent protection layer is directly formed over the front surface of the chip substrate, the transparent protection layer may have a substantially low probability of being separated from the front surface of the chip substrate, thereby reducing the dust-free requirements for the use environment.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor packaging method, comprising:
    providing a chip, wherein the chip includes:
        a chip substrate, having a front surface and a back surface, wherein the front surface includes a photosensitive region,
        a plurality of pads disposed at the front surface of the chip substrate and around the photosensitive region, wherein the chip substrate contains a through-hole formed from the back surface of the chip substrate, and the plurality of pads are exposed from the through-hole, and
        a transparent protection layer over the front surface of the chip substrate, wherein the transparent protection layer covers the photosensitive region and the plurality of pads; and
    electrically connecting each pad of the plurality of pads to a circuit board through a corresponding metal rewiring layer in the through-hole.

2. The method according to claim 1, wherein providing the chip includes:
    providing a wafer, wherein:
        the wafer contains a plurality of chip substrates arranged in a matrix, and a dicing groove is formed between adjacent chip substrates of the plurality of chip substrates,
        the wafer has a front surface and a back surface, the front surface of the wafer is the front surface of the chip substrate, and the back surface of the wafer is the back surface of the chip substrate, and
        the photosensitive region and the plurality of pads disposed around the photosensitive region are disposed over the front surface of the chip substrate;
    forming the transparent protection layer over the front surface of the wafer, wherein the transparent protection layer covers the photosensitive region and the plurality of pads on each chip substrate;

forming the through-hole in the wafer from the back surface of the wafer at a position corresponding to the dicing groove, to make the plurality of pads on both sides of the dicing groove on each chip substrate be exposed from the through-hole; and cutting the wafer and the transparent protection layer between adjacent two through-holes, to obtain a plurality of single chips.

3. The method according to claim 2, wherein the transparent protection layer is formed by:

forming a transparent protection film over the front surface of the wafer by spin coating, dispensing or printing, and curing the transparent protection film to form the transparent protection layer.

4. The method according to claim 3, wherein curing the transparent protection film includes:

an ultraviolet irradiation, or a baking.

5. The method according to claim 2, before forming the through-hole in the wafer from the back surface of the wafer at the position corresponding to the dicing groove, to make the plurality of pads on both sides of the dicing groove on each chip substrate be exposed from the through-hole, further including:

providing a substrate on a side of the transparent protection layer away from the wafer;

polishing the back surface of the wafer to make the wafer have a thickness less than or equal to a predetermined thickness; and after electrically connecting the pad of the plurality of pads of the chip to the circuit board through the metal rewiring layer in the through-hole, removing the substrate.

6. The method according to claim 2, wherein forming the through-hole in the wafer from the back surface of the wafer at the position corresponding to the dicing groove, to make the plurality of pads on both sides of the dicing groove on each chip substrate be exposed from the through-hole includes:

a mechanical cutting method.

7. The method according to claim 6, wherein:

a size of the through-hole gradually increases from a side at the plurality of pads to the back surface of the chip substrate.

8. The method according to claim 1, wherein electrically connecting each pad of the plurality of pads to the circuit board through the corresponding metal rewiring layer in the through-hole includes:

forming the metal rewiring layer in the through-hole, wherein one end of the metal rewiring layer is electrically connected to the pad of the chip, and another end of the metal rewiring layer is electrically connected to the circuit board.

9. The method according to claim 8, wherein forming the metal rewiring layer in the through-hole includes:

forming a first mask layer on the back surface of the chip substrate and a surface of the through-hole, and forming a first opening in the first mask layer at a position corresponding to the pad, forming a first seed layer on a surface of the first mask layer away from the chip substrate, forming a second mask layer on a surface of the first seed layer away from the chip substrate, and forming a second opening in the second mask layer above the pad, forming the metal rewiring layer in the second opening, and removing the second mask layer and the first seed layer outside the metal rewiring layer.

10. The method according to claim 9, wherein after removing the second mask layer and the first seed layer outside the metal rewiring layer, further including:

forming a first barrier layer on a surface of the metal rewiring layer facing away from the plurality of pads, and forming a third opening in the first barrier layer, and forming a solder ball in the third opening, and electrically connecting the solder ball with the circuit board.

11. A semiconductor package device, comprising:

a chip substrate, having a front surface and a back surface, wherein the front surface includes a photosensitive region;

a plurality of pads, disposed at the front surface of the chip substrate and around the photosensitive region, wherein the chip substrate contains a through-hole at a position corresponding to the plurality of pads, and the plurality of pads are exposed from the through-hole;

a transparent protection layer, disposed over the front surface of the chip substrate and covering the photosensitive region and the plurality of pads; and a circuit board, electrically connected to each pad of the plurality of pads through a corresponding metal rewiring layer in the through-hole.

12. The device according to claim 11, wherein:

the transparent protection layer is formed by spin coating, dispensing or printing.

13. The device according to claim 11, wherein:

the transparent protection layer is made of a material capable of being cured by an ultraviolet irradiation or a baking.

14. The device according to claim 11, wherein:

the transparent protection layer is made of a material including one or more of an inorganic transparent material and an organic transparent material, wherein the inorganic transparent material includes at least one of silicon nitride and silicon oxynitride, and the organic transparent material includes polysiloxane.

15. The device according to claim 11, wherein:

a size of the through-hole gradually increases from a side at the plurality of pads to the back surface of the chip substrate.

16. The device according to claim 11, wherein:

the metal rewiring layer is disposed over the back surface of the chip substrate and extended into the through-hole, and one end of the metal rewiring layer is electrically connected to the pad, and another end of the metal rewiring layer is electrically connected to the circuit board.

17. The device according to claim 16, further including:

a first mask layer, disposed between the back surface of the chip substrate and the metal rewiring layer, wherein the first mask layer contains a first opening at a position corresponding to the pad, and a first seed layer, disposed between the first mask layer and the metal rewiring layer, wherein the pad, the first seed layer, and the metal rewiring layer are electrically connected to each other.

18. The device according to claim 17, further including:

a first barrier layer, disposed on a side of the metal rewiring layer away from the plurality of pads, wherein the first barrier layer contains a third opening, and a solder ball, disposed in the third opening and electrically connecting the metal rewiring layer with the circuit board.

19. The device according to claim 17, further including:
a first barrier layer, disposed on a side of the metal rewiring layer away from the plurality of pads, wherein the first barrier layer contains a third opening,
a second seed layer, disposed on a side of the first barrier layer away from the plurality of pads and covering the third opening,
an under-ball metal layer, disposed on a side of the second seed layer away from the plurality of pads, and
a solder ball, disposed on a side of the under-ball metal layer away from the plurality of pads, wherein the solder ball, the under-ball metal layer, the second seed layer, and the metal rewiring layer are electrically connected to each other.

20. The device according to claim 11, wherein:
the chip substrate has a thickness less than or equal to a predetermined thickness.

\* \* \* \* \*